United States Patent [19]
Yamaguchi et al.

[11] 4,121,243
[45] Oct. 17, 1978

[54] COLOR SUBCARRIER GENERATOR

[75] Inventors: Namio Yamaguchi, Ibaragi; Yasuyuki Sato, Takatsuki, both of Japan

[73] Assignee: Matsushita Electric Industrial Co., Ltd., Japan

[21] Appl. No.: 782,245

[22] Filed: Mar. 28, 1977

[30] Foreign Application Priority Data

Apr. 16, 1976 [JP] Japan .................................. 51-43846
Aug. 9, 1976 [JP] Japan .................................. 51-95283
Sep. 10, 1976 [JP] Japan ................................ 51-109047
Sep. 13, 1976 [JP] Japan ................................ 51-110237

[51] Int. Cl.$^2$ ......................... H04N 9/46; H04N 9/50
[52] U.S. Cl. ......................................... 358/19; 358/25
[58] Field of Search ............................. 358/17, 19, 25

[56] References Cited

U.S. PATENT DOCUMENTS

| 3,585,285 | 6/1971 | Rennick | 358/17 |
| 4,006,423 | 2/1977 | Kuniyoshi et al. | 358/19 |
| 4,020,500 | 4/1977 | Harwood | 358/19 |

*Primary Examiner*—Robert L. Richardson
*Attorney, Agent, or Firm*—Stevens, Davis, Miller & Mosher

[57] ABSTRACT

A color signal processing apparatus, particularly a circuit for generating a color sub-carrier wave for demodulation, used in a color television receiver set to demodulate a carrier color signal to reproduce a color image, is disclosed. The apparatus comprises an oscillation circuit including four differential amplifiers to synthesize oscillation signals having phases which differ 90° from each other to produce a color subcarrier wave, a color-phase adjusting circuit for changing phases of the oscillation signals from the oscillation circuit by changing bias voltages of the differential amplifiers, and a phase detection circuit for comparing the phases of the oscillation signals having the phases changed by the color phase adjusting circuit with a phase of a color burst signal to change the bias voltages of the differential amplifiers in the oscillation circuit depending on the comparison.

10 Claims, 15 Drawing Figures

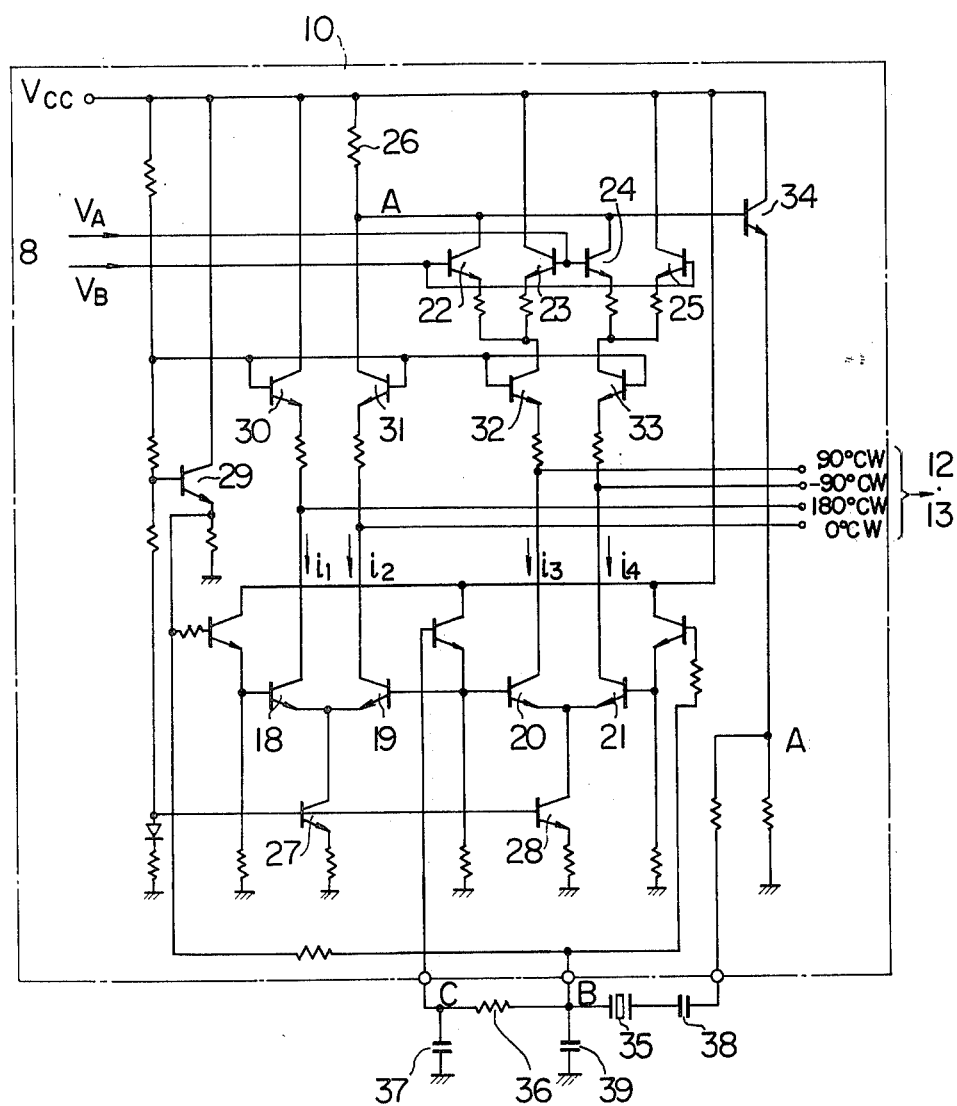
F I G. 4

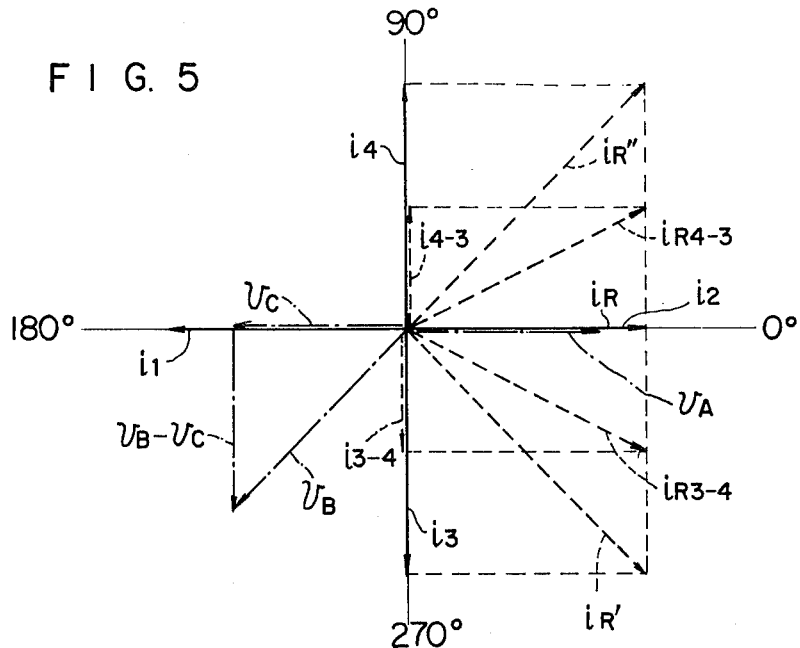
F I G. 5
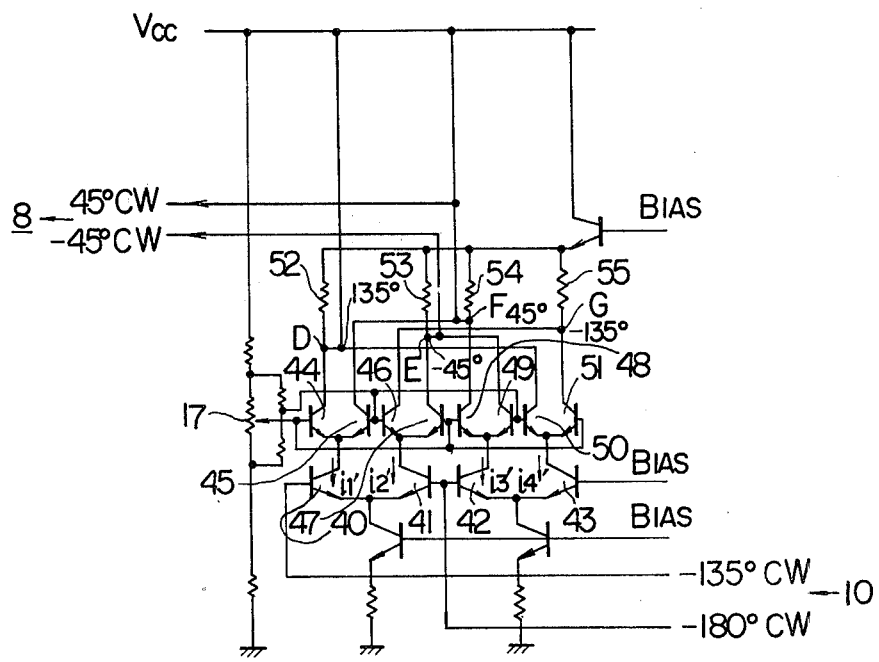
F I G. 6

COLOR SUBCARRIER GENERATOR

The present invention relates to a color signal processing apparatus used in a color television receiver set to demodulate a carrier color signal to reproduce a color image, and more particularly to a circuit for generating a color sub-carrier wave for demodulation.

Color signal processing apparatus used in prior art color television receiver sets are generally classified into two categories as shown in FIGS. 1a and 1b. In FIG. 1a, a burst signal applied to a terminal 1 is phase-adjusted in a color phase adjusting circuit 2 having a coil or the like and applied to an AFPC (Automatic Frequency and Phase Control) phase detection circuit 3. On the other hand, an oscillation output from an oscillation circuit 4 for a color subcarrier wave is also applied to the AFPC phase detection circuit 3 where the phases of both signals are compared to control an oscillation phase of the oscillation circuit 4, and the oscillation output of the oscillation circuit 4 is supplied to a color demodulation circuit 5. In FIG. 1b, the burst signal applied to the terminal 1 and the oscillation output of the oscillation circuit 4 for the color sub-carrier wave are directly phase-compared in the AFPC phase detection circuit 3 to control the oscillation phase, and the oscillation output of the oscillation circuit 4 is phase-adjusted in the color phase adjusting circuit 2 and supplied to the color demodulation circuit 5. Numeral 6 denotes a phase detector for a color killer.

In the circuit of FIG. 1a, however, the amplitude of the burst signal may change during the color phase adjustment in the color phase ajusting circuit 2. Particularly when an electric field strength is small and the amplitude of the burst signal is small, the detected outputs of the phase detectors 3 and 6 for AFPC and color killer change with the adjustment of color phase so that the change in the range of pull-in in a control characteristic of the oscillation phase and the change in a control sensitivity for color killer take place; as a result, a satisfactory color phase adjustment has not been attained. Furthermore, since a terminal for a coil for the color phase adjustment is required, the circuit is not suitable for an integrated circuit structure. In the circuit of FIG. 1b, although the problem of control for the AFPC and the color killer encountered in the above circuit does not occur, waveform distortion is produced in the color phase adjusting circuit 3 because the oscillation output of the color sub-carrier wave oscillation circuit 4 is adjusted in the color phase adjusting circuit 3. Particularly when a differential amplifier is used to control the phase, a large waveform distortion is included. When such a distorted signal is applied to the color demodulation circuit 5, the color demodulation output also includes distortion. Thus, it has been very difficult to attain a satisfactory characteristic by the prior art circuits.

It is an object of the present invention to overcome the drawbacks encountered in the prior art circuit and provide an apparatus which can adjust the color phase without adversely affecting the characteristic of the color demodulation.

It is a second object of the present invention to provide an apparatus including an oscillation circuit suitable for constructing in an integrated circuit structure.

It is a third object of the present invention to provide an apparatus including a phase shifting circuit for color phase adjustment which is suitable for construction in an integrated circuit structure.

It is a fourth object of the present invention to provide an apparatus including a phase detection circuit which is suitable for constructing in an integrated circuit structure.

The above and other objects, features and advantages of the present invention will be apparent from the following detailed description of the invention when taken in conjunction with the accompanying drawings, in which:

FIG. 4 shows a circuit diagram of an oscillation circuit of the apparatus.

FIG. 5 shows a vector diagram for explaining the operation of the oscillation circuit of FIG. 4.

FIG. 6 shows a circuit diagram of a phase shifting circuit for color phase adjustment of the apparatus of FIG. 2.

Figure 1A:
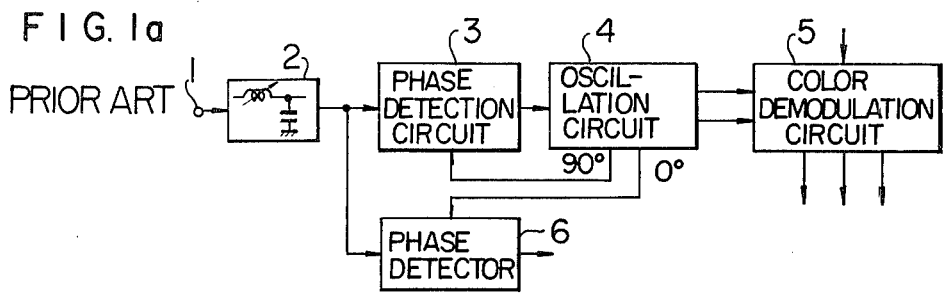
FIGS. 1a and 1b show block diagrams of a prior art apparatus.
Figure 1B:
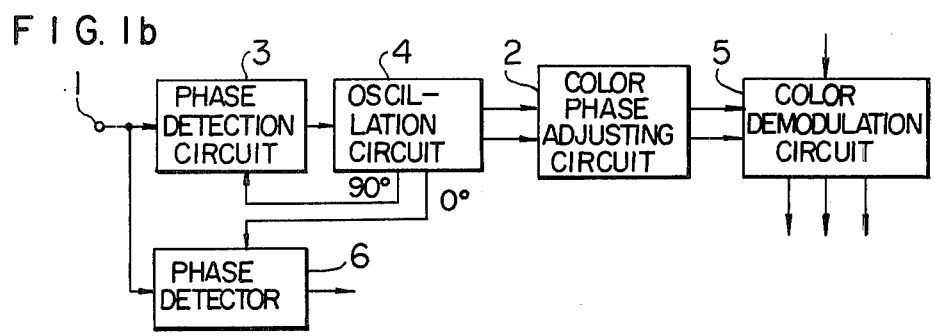
Figure 2:
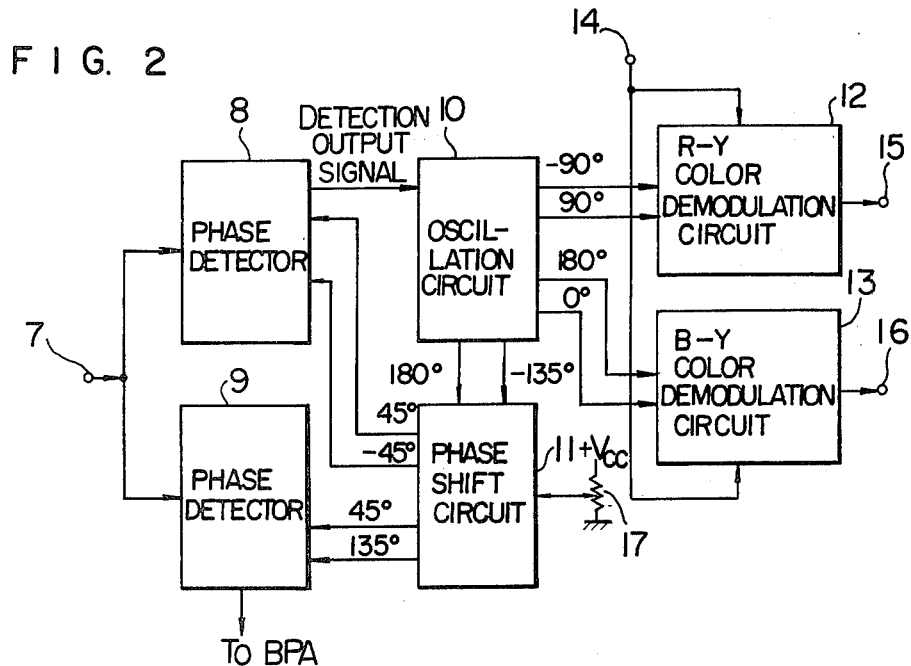
FIG. 2 shows a block diagram of one embodiment of an apparatus of the present invention.

FIG. 2 shows a block diagram of a basic construction of the present invention, in which numeral 7 denotes an input terminal for a burst signal, 8 a phase detection circuit for AFPC, 9 a phase detection circuit for color killer, 10 an oscillation circuit for color sub-carrier wave, 11 a phase shifting circuit for color phase adjustment, 12 and 13 R-Y and B-Y color demodulation circuits, respectively, 14 an input terminal for a carrier color signal, and 15 and 16 R-Y and B-Y demodulation output terminals, respectively.

In the apparatus shown, oscillation outputs of the phases of 180° and −135° are applied to the color phase adjusting circuit 11 comprising a differential amplifier, and a bias voltage of the differential amplifier of the color phase adjusting circuit 11 is changed by a potentiometer 17 to adjust the phases to produce a pair of compare signals, the phases of which can be changed around 45° and −45°, respectively. The resulting compare signals are applied to the AFPC phase detector 8 where the phases of 45° and −45° of the compare signals are compared with the phase of the input burst signal at 90° phase. A detection signal therefrom is used to control the oscillation phase of the oscillation circuit 10. A pair of oscillation outputs of ± 90° phases and a pair of oscillation outputs of 0° and 180° phases taken out of the color subcarrier wave oscillation circuit 10 are fed to the R-Y and B-Y color demodulation circuits 12 and 13, respectively to produce R-Y and B-Y color demodulation outputs at the terminals 15 and 16, respectively.

The compare signals of 45° and 135° phases taken out of the color phase adjusting circuit 11 are applied to the phase detection circuit 9 for the color killer.

With the circuit arrangement described above, since the output waveforms of the color phase adjusting circuit 11 do not substantially change by the phase adjustment of the oscillation outputs, the amplitude and waveform distortion can be eliminated and the AFPC phase detection circuit 8 is not affected by the phase adjustment so that the control characteristic of the oscillation phase, i.e. the color phase, is not affected. Similarly, the phase detection for the color killer is not affected.

Furthermore, according to the above arrangement, even if a small amplitude and waveform distortion occurs in the color phase adjusting circuit 11 during the color phase adjustment, the affect by the waveform distortion to the demodulation characteristic is of no significant problem because the output of the color phase adjusting circuit 11 is not used for color demodulation but applied only to the AFPC phase detection circuit 8 and the color killer phase detection circuit 9. Thus, by using the oscillation output of the color sub-carrier wave oscillation circuit 10 for the color demodulation, a proper color demodulation can be carried out with a proper waveform.

In addition, according to the above arrangement, all of the circuits can be constructed by transistor circuits such as differential amplifiers and the only adjusting means required is the bias input terminal from the potentiometer 17. Therefore, the number of terminals can be reduced and the circuit arrangement is suitable for an integrated circuit structure.

Examples of the phase relations which can be used in the present apparatus are shown in the Table below.

|  | Example 1 | Example 2 | Example 3 |
|---|---|---|---|
| APC detection CW | 45° | 45° | 45° |
| (Carrier Wave) | −45° | −135° | −135° |
| Killer (& APC) detection CW | 45° | −45° | −45° |
|  | 135° | 135° | 135° |
| R-Y demodulation CW | −90° | −90° | −90° |
|  | +90° | 0° | +90° |
| B-Y demodulation CW | 180° | 90° | 180° |
|  | 0° | 0° | 0° |
| Burst signal processing | Direct Input 0° | 0° | 45° advanced |

Figure 3:
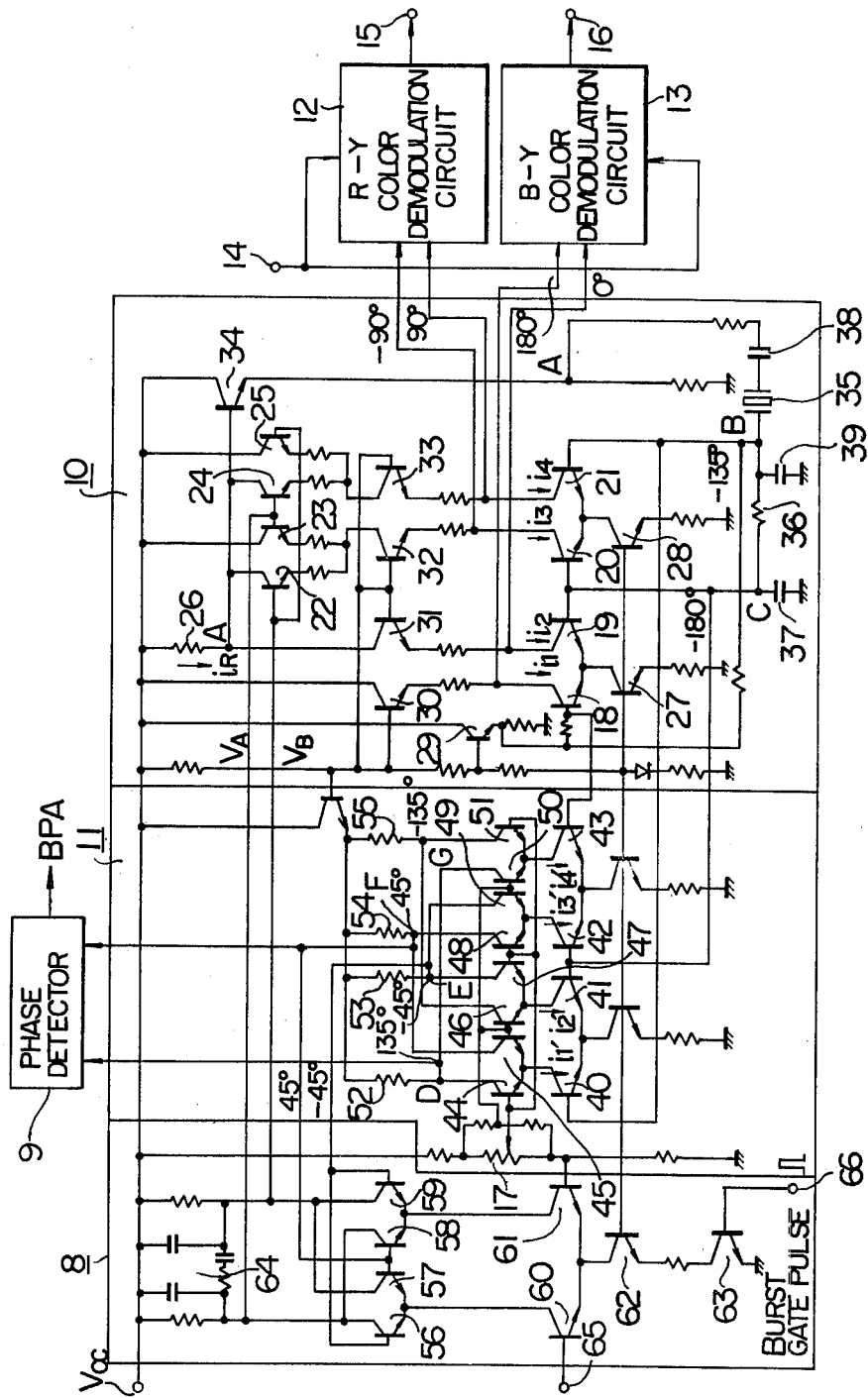
FIG. 3 shows a circuit diagram of an embodiment of a particular circuit of the apparatus of FIG. 2.

Embodiments of particular circuits configuration of the above apparatus are now explained. FIG. 3 shows an overall circuit diagram thereof. FIG. 4 is a circuit diagram illustrating the construction of the oscillation circuit 10, and FIG. 5 shows a vector diagram for explaining the operation thereof. In FIG. 4, the oscillation circuit 10 comprises four emitter coupled differential amplifiers including first and second transistors 18 and 19, third and fourth transistors 20 and 21, fifth and sixth transistors 22 and 23, and seventh and eighth transistors 24 and 25, respectively. Those transistors constitute an oscillation amplifier circuit. Of those transistors, the collector of the third transistor 20 is connected to the emitters of the fifth and sixth transistors 22 and 23, and the collector of the fourth transistor 21 is connected to the emitters of the seventh and eighth transistors 24 and 25. The collectors of the second, fifth and seventh transistors 19, 22 and 24 are connected to a common load resistor 26, the other end of which is connected to a power supply. The collectors of the first, sixth and eighth transistors 18, 23 and 25 are connected to the power supply. Numerals 27 and 28 denote constant current transistors, 30 to 34 denote buffer transistors and 29 denotes a bias transistor. Those transistors may be omitted.

An output across the common load resistor 26 is taken out through the transistor 34 and applied to a resonator 35 such as a crystal resonator turned to a color sub-carrier wave frequency and thence applied to the base of the fourth transistor 21. The output of the resonator 35 is retarded by a given angle by a resistor 36 and a capacitor 37 and thence applied to the bases of the second and third transistors 19 and 20. A fixed bias voltage from the transistor 29 is applied to the base of the first transistor 18. Applied between the bases of the fifth and eighth transistors 22 and 25 and the sixth and seventh transistors 23 and 24 are differentially changing oscillation controlling voltages $V_A$ and $V_B$ from the AFPC detection circuit 8, as the bias voltages.

Four oscillation outputs of the phases which differ 90° from each other (180°, 0°, −90° and 90°) are produced from the collectors of the first, second, third and fourth transistors 18, 19, 20 and 21.

The output voltage developed across the common load resistance 26 in the oscillation circuit 10 is shown by $v_A$ in FIG. 5. In supplying this output signal voltage to the resonator 35, the capacitances of capacitors 38 and 39 are appropriately selected such that a signal voltage developed across the capacitor 39, that is, the signal voltage at a point B is represented by $v_B$ and the resistor 36 and the capacitor 37 are appropriately selected such that a signal voltage developed across the capacitor 37, that is, the signal voltage at a point C is represented by $v_c$. In this case, since the oscillation amplifier circuit unavoidably includes a phase retardation, the magnitudes of the resistor and the capacitors are selected such that $v_B$ is of −135° phase relative to $v_A$ and $v_C$ is of −180° phase relative to $v_A$ when the above phase retardation is included. In the illustrated example, the phase retardation of 45° is assumed and it has been included in the vector diagram. Accordingly, the signal voltages at the points B and C are actually of the phases 45° in advance of those shown.

Since the signal voltage $v_B$ is applied to the base of the fourth transistor 21 and the signal voltage $v_C$ is applied to the bases of the second and third transistors 19 and 20, the resulting collector currents flowing in the collectors of the first through fourth transistors 18 to 21 are of the phases which are different 90° from each other as shown by $i_1$ to $i_4$ in FIG. 2. Thus, the outputs at the output terminals taken from the respective collectors are four CW (Carrier Wave) oscillation outputs of 0°, 90°, 180° and 270° phases, which are applied to the phase demodulation circuits 12 and 13.

On the other hand, the collector currents $i_3$ and $i_4$ of the third and fourth transistors 20 and 21 are taken out at a rate determined by the bias oscillation controlling bias voltages $V_A$ and $V_B$ in the fifth through eighth transistors, and they are combined with the collector current $i_2$ of the second transistor 19 for controlling the oscillation frequency and the phase. Namely, when the control voltages $V_A$ and $V_B$ are equal, the collector current of the fifth and seventh transistors 22 and 24 are equal so that the collector currents $i_3$ and $i_4$ are sampled at the same amplitude. Since the phases of those A.C. components are opposite to each other, the resulting combined signal is zero and only the collector current $i_2$ of the second transistor 19 flows as the A.C. component through the common load resistor 26 resulting in a voltage drop iR, and the circuit continues to oscillate at the phase shown by a solid line in FIG. 5.

When the magnitudes of the oscillation controlling bias voltages $V_A$ and $V_B$ change such that a relation of $V_A < V_B$ is met, the collector current $i_3$ of the third transistor 20 is sampled at a larger rate than the collector current $i_4$ of the fourth transistor 21 so that a combined current as shown by $i_{3-4}$ in FIG. 5 flows resulting in a current $i_{R3-4}$ combined with the collector current $i_2$ of the second transistor 19 in the common load resistor 26. As a result, the plane is shifted relative to the previous case such that oscillation occurs at a frequency of the resonance characteristic point such as the resonator 35 which brings about a phase characteristic which allows a positive feedback with reference to $i_{R3-4}$ to take place.

On the other hand, when a relation of $V_A > V_B$ is met, the collector current $i_4$ is sampled at a higher rate then the collector current $i_3$ and the resultant current is given by $i_{4-3}$ in FIG. 5 so that oscillation occurs at a frequency of the resonance characteristic point which brings about a phase characteristic which allows a positive feedback with reference to $i_{R4-3}$ to take place.

In this manner, by changing the oscillation controlling bias voltages $V_A$ and $V_B$, the current in the common load resistance 26 can be varied between $i_{R'}$ and $i_{R''}$ over the phases of $\pm 45°$ so that the oscillation phase can be controlled between $+45°$ and $-45°$. It should be understood that when the oscillation phase is changed in the manner described above, the collector currents $i_1$ to $i_4$ of the first through fourth transistors change in one direction by the same amount each time and the phase relation of 90° separation from each other is maintained.

In the oscillation circuit 10 described above, since all circuits but the resonator and the phase retardation circuit are constituted by the differential amplifier of directly coupled transistor circuits it has an advantage that it is suitable for an integrated circuit structure. For example, a circuit section surrounded by a double dotted line in FIG. 4 may be integrated in a semiconductor circuit. In this case, only three terminals are required for off-chip circuits. Thus the number of terminals required is minimized. Furthermore, since the circuit is constructed by the differential amplifiers, a stable operation during temperature variations is attained and a stable oscillation is achieved.

Furthermore, according to the oscillation circuit 10, since four oscillation signal outputs of the phases which differ 90° from each other can be directly taken out without using phase shifting circuits, they can be directly supplied to the phase demodulation circuit comprising the differential amplifiers so that the color demodulation circuit can be constructed in the simplest way. In addition, since the phase shift circuit is not necessary, the oscillation circuit may be directly coupled to the color demodulation circuit. This is also advantageous in constructing the circuit as an integrated circuit structure.

Figure 7:
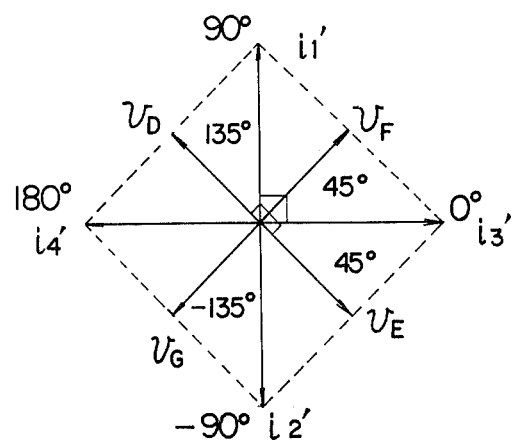
FIGS. 7 and 8 show vector diagrams for explaining the operation of the phase shifting circuit of FIG. 6.
Figure 8:
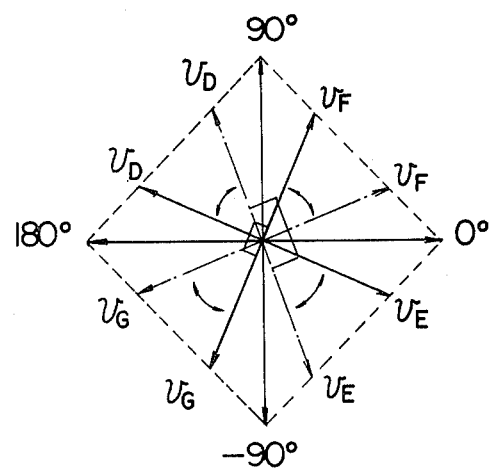

Now referring to FIGS. 6 to 8, the phase shifting circuit 11 for the color phase adjustment is explained. In FIG. 6, the phase shifting circuit 11 comprises two emitter coupled differential amplifiers including first and second transistors 40 and 41 and third and fourth transistors 42 and 43, respectively, and four emitter coupled differential amplifiers including fifth and sixth transistors 44 and 45, seventh and eighth transistors 46 and 47, ninth and tenth transistors 48 and 49, and eleventh and twelveth transistors 50 and 51, respectively. The emitters of the fifth and sixth transistors 44 and 45 constituting the differential amplifier are connected to the collector of the first transistor 40, the emitters of the seventh and eighth transistors 46 and 47 forming the differential amplifier are connected to the collector of the second transistor 41, the emitters of the ninth and tenth transistors 48 and 49 forming the differential amplifier are connected to the collector of the third transistor 42, and the emitters of the eleventh and twelveth transistors 50 and 51 forming the differential amplifier are connected to the collector of the fourth transistor 43.

The collectors of the fifth and eleventh transistors 46 and 50 are connected together to a load resistor 52, the collectors of the eighth and tenth transistors 47 and 49 are connected together to a load resistor 53, the collectors of the sixth and ninth transistors 47 and 48 are connected together to a load resistor 54, and the collectors of the seventh and twelveth transistors 46 and 51 are connected together to a load resistor 55. Remaining transistors in the phase shifting circuit 11 are constant current transistors.

A bias voltage for the color phase adjustment derived by dividing the power supply voltage by a color phase adjusting potentiometer 17 is applied to the bases of the fifth, eighth, ninth and twelveth transistors.

The oscillation signals of $-135°$ and $-90°$ phases taken out off the bases of the second and third transistors 19 and 20 and the base of the fourth transistor 21, respectively, of the oscillation circuit 10 described above, are applied to the bases of the first through third transistors 40, 41 and 42 of the color phase adjusting phase shifting circuit 11, and a fixed bias is applied to the transistor 43. The phases of the resulting collector currents differ 90° from each other as shown in FIG. 7. Thus, phase shifted signals $v_D$ to $v_G$ of 135°, $-45°$, 45° and $-135°$ phases as shown in FIG. 7 are produced at points D to G of the collector resistors 52 to 55 of the transistors 45 to 51 forming the differential amplifiers connected to the collectors of the transistors 40 to 43. The phases of the signals $v_D$ to $v_G$ can be changed by changing the gains of the differential amplifiers comprising the transistors 44 to 51 by adjusting the potentiometer 17 while maintaining a phase difference of 90° from each other. Thus, by applying the sub-carrier waves of 45° and $-45°$ phases developed across the resistors 54 and 53 to the phase detection circuit 8, the AFPC control can be attained.

In this manner, since the phase shifting circuit 11 enables the phase adjustment by the differential amplifiers while maintaining the 90° phase difference from each other, no error is induced and a satisfactory color phase adjustment is attained. Furthermore, since all circuits are directly coupled, the circuit arrangement is suitable for an integrated circuit structure.

Figure 9:
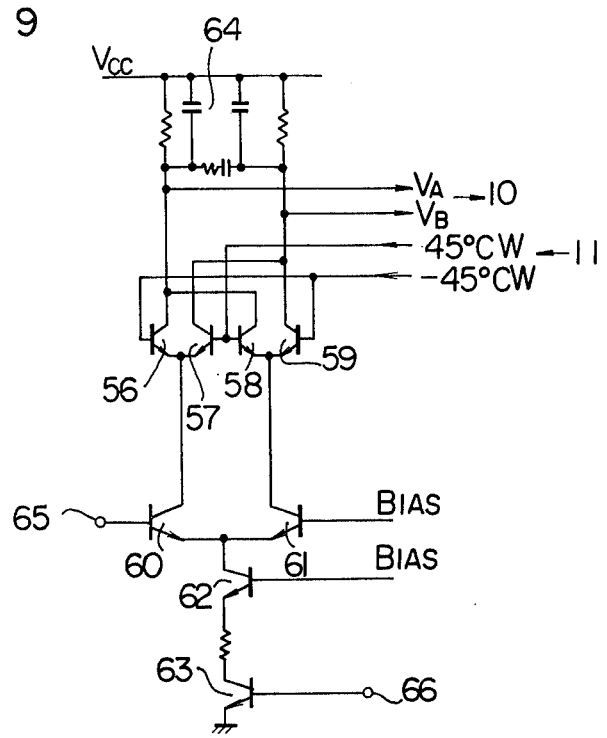
FIG. 9 shows a circuit diagram of a phase detection circuit of the apparatus.
Figure 10:
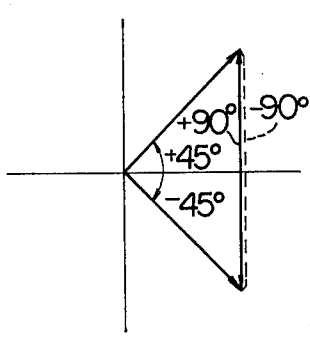
FIG. 10 shows a vector diagram for explaining the operation of the phase detection circuit of FIG. 9.

Referring now to FIGS. 9 and 10, the phase detection circuit is explained. In FIG. 9, numerals 56 to 59 denote first through fourth transistors forming two emitter coupled differential amplifiers, the common emitters of which are connected in series with fifth and sixth input transistors 60 and 61, respectively, the emitters of which are connected together to form a differential amplifier and grounded through seventh constant current transistor 62 and eighth gate transistor 63, respectively. The collectors of the first and third transistors 56 and 58 and the collectors of the second and fourth transistors 57 and 59 are connected together, respectively, to form a combined differential amplifier, and connected to the power supply through a load circuit 64 including a filter circuit. A color burst signal at a terminal 65 is applied to the fifth transistor 60, predetermined fixed biases are applied to the bases of the sixth and seventh transistors 61 and 62, and a burst extracting pulse at a terminal 66 is applied to the base of the eighth transistor 63. When the burst signal is to be phase detected, the gate transistor 63 is arranged as described above so that it gates only during the burst period.

The oscillation signal of +45° phase is applied to respective one pair of bases of the differential amplifiers comprising the first through fourth transistors 56 to 59 and the oscillation signal of −45° phase is applied to the other pair of bases of the differential amplifiers.

With the above arrangement, the color burst signal can be phase detected at a differential phase between the +45° phase and the −45° phase, that is, at +90° phase or −45° phase as shown in FIG. 10, and the detection output $V_A$ phase detected at +90° phase is produced at the collectors of the first and third transistors 56 and 58 while the detection output $V_B$ phase detected at the −90° phase is produced at the collectors of the second and fourth transistors 57 and 59.

The oscillation signals of +45° phase and −45° phase are then applied to the pairs of input terminals of the differential amplifiers to effect the phase detection in accordance with the differential phase. As a result, the detection is always carried out at the +90° phase or −90° phase irrespective of the phase shifts in the transistors.

While FIG. 9 shows the combined differential amplifier, it should be understood that any conventional differential amplifier may be used.

The detection outputs $V_A$ and $V_B$ change differentially. By applying those detection outputs $V_A$ and $V_B$ to the bases of the fifth and eight transistors 22 and 25 and the bases of the sixth and seventh transistors 23 and 24 in the oscillation circuit 10 as bias voltages for controlling the oscillation, the oscillation circuit 10 is automatically controlled such that it oscillates at the phase shifted by the amount corresponding to the phase shift to the color burst signal by the phase shifting circuit 11.

Referring to FIGS. 11 to 14, the circuit for applying a color burst gating pulse to the terminal 66 of the phase detection circuit 8 is explained. This circuit produces a pulse which is applied to both a pedestal clamp circuit and the phase detection circuit 8.

Figure 11:
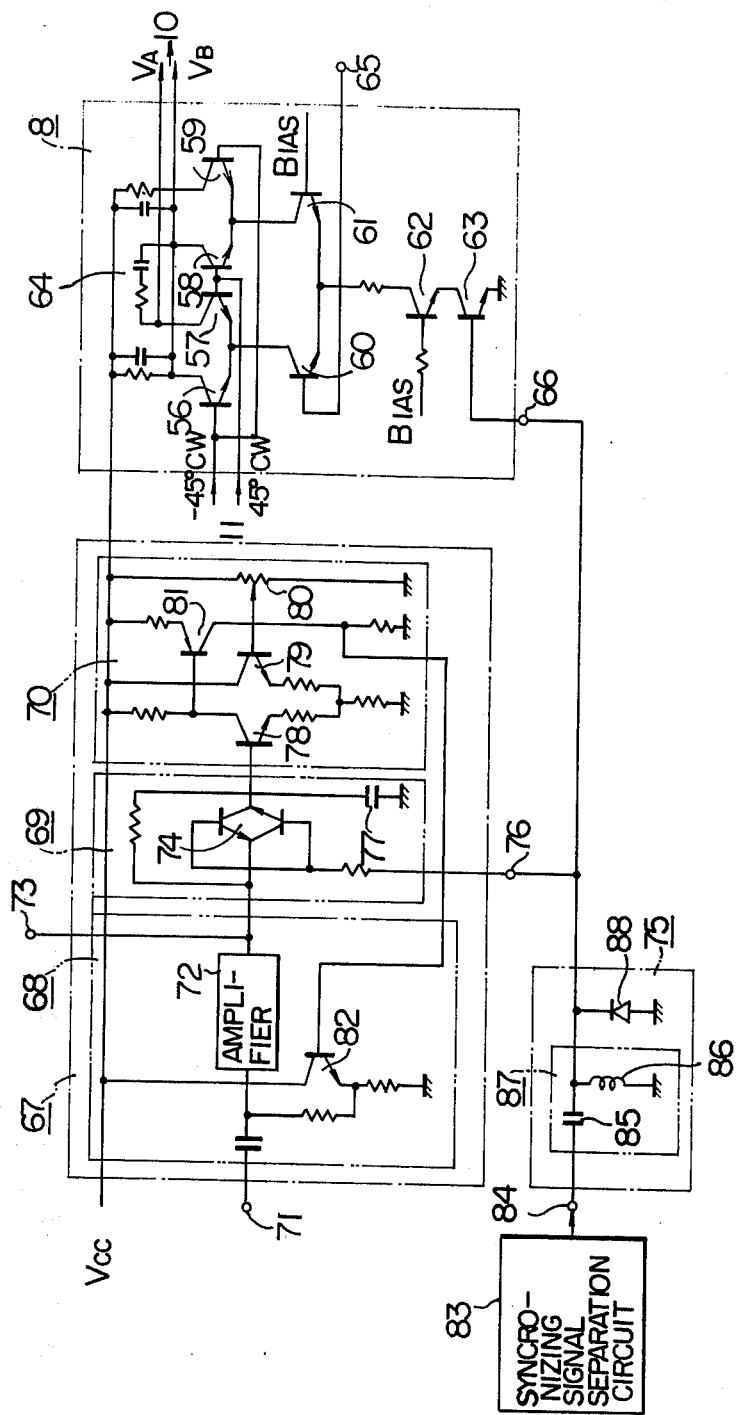
FIG. 11 shows a circuit diagram of the phase detection circuit and a color burst gate pulse generating circuit.
Figure 12:
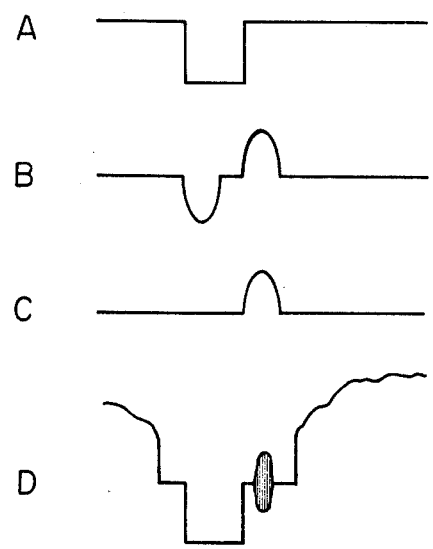
FIG. 12 shows waveforms for explaining the operation of the color burst gate pulse generating circuit of FIG. 11.
Figure 13:
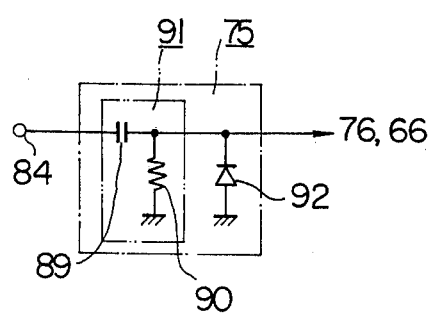
FIG. 13 shows a circuit diagram of another color burst gate pulse generating circuit used in the apparatus.
Figure 14:
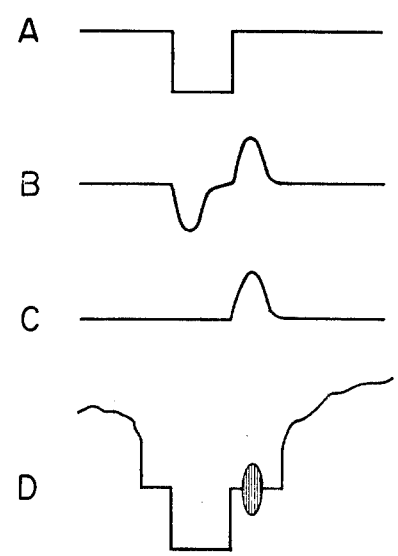
FIG. 14 shows waveforms for explaining the operation of the color burst gate pulse generating circuit of FIG. 13.

In FIG. 11, numeral 67 denotes a pedestal clamp circuit for pedestal clamping a video signal and it comprises a video amplifier circuit 68, a pedestal level detection circuit 69 and a clamp level control circuit 70. The video signal applied to an input terminal 71 is amplified by an amplifier 72 an output of which is fed to an output terminal 73 and also applied to a switching transistor 74 of the pedestal level detection circuit 69. A clamping pulse is applied to the switching transistor 74 from a pulse generation circuit 75 through a clamping pulse input terminal 76 so that the switching transistor 74 is rendered conductive only for the duration of the clamping pulse and a pedestal level of the video signal at that time is sensed and held in a holding capacitor 77. The held pedestal level detection output is applied to a transistor 78 of the clamp level control circuit 70 while a brightness level setting voltage set by a brightness level setting potentiometer 80 is applied to the other transistor 79. Since the transistors 78 and 79 form a differential amplifier, a differential voltage between the two input voltages is produced at the collector of the transistor 78. This output voltage is fed back to a transistor 82 in the video amplifier circuit 68 as the clamp level control voltage, through a transistor 81 to control a D.C. level of the video signal so that the pedestal level of the output video signal is rendered equal to the brightness level setting voltage. Thus, by this feedback loop, the pedestal level of the video signal can be clamped to a constant level so that a D.C. component of the video signal can be restored.

The pulse generating circuit 75 generates a pulse immediately after a trailing edge of a horizontal synchronizing signal which is separated by a synchronizing signal separation circuit 83 and applied through an input terminal 84. This pulse is applied to the pedestal clamp circuit 67 and the phase detection circuit 8 through the input terminals 76 and 66 as the clamping pulse and the color burst gating pulse, respectively.

The pulse generating circuit 75 may comprise a resonance circuit 87 including a capacitor 85 and a coil 86 as shown in FIG. 11 so that it produces a ringing voltage as shown in FIG. 12B when a horizontal synchronizing pulse shown in FIG. 12A is applied, and one polarity components of the ringing voltage are taken out by a switching device such as a diode 88 to produce a pulse immediately after the trailing edge of the horizontal synchronizing pulse A. In this manner by the use of the resonance circuit 87, a most desirable waveform of the pulse C can be produced.

The pulse generating circuit 75 may comprises a differentiation circuit 91 including a capacitor 89 and a resistor 90 so that it produces a differentiated voltage as shown in FIG. 14B when a horizontal synchronizing signal shown in FIG. 14A is applied and one polarity of the components of the differentiated voltage are taken out by a switching device such as a diode 92 to produce a pulse immediately after the trailing edge of a horizontal synchronizing pulse A as shown in FIG. 14C. In this case, again, a desirable waveform of the pulse C is produced.

As described above, by producing the pulse C immediately after the trailing edge of the horizontal synchronizing signal, the pulse C can be produced during the period of the back porch of the horizontal synchronizing signal in the video signal without overlapping the horizontal synchronizing signal. By using the pulse C as the clamping pulse and the color burst gating pulse, the pedestal level of the video signal can be exactly detected to exactly carry out the pedestal clamping. Furthermore, extraneous signals other than the burst signal are not taken out so that correct burst gating and AFPC operation can be carried out.

What is claimed is:

1. A color signal processing circuit for a color television receiver comprising:
 a color demodulation circuit;
 an oscillator circuit comprising:
  a first, second, third and fourth differential amplifiers,
  means for coupling a pair of outputs from said second differential amplifier respectively with said third and fourth differential amplifiers,
  means for combining the outputs of said first, third and fourth differential amplifier,
  a resonator coupled to the output of said combining means, first means for phase shifting the output of said resonator, means for coupling the output of said first phase shifting means to the inputs of said first and second differential amplifiers, and means for taking from the outputs of said first and second differential amplifiers four output signals at a frequency of a color subcarrier wave but differing from one another by 90° and supplying these four signals to said color demodulation circuit;

a phase shifter circuit comprising:

fifth and sixth differential amplifier circuits, means for coupling two phase displaced signals from said oscillation circuit to the inputs of said fifth and sixth differential amplifier circuits, means responsive to the outputs of said fifth and sixth differential amplifiers for producing a pair of output signals at a frequency of said color subcarrier wave but phase displaced, and means for adjusting the bias voltages of said fifth and sixth differential amplifier circuits for changing the phase of said pair of output signals;

a phase detecting circuit comprising:

a seventh differential amplifier, a switching device connected in series with said seventh differential amplifier, means for supplying a color burst signal to the input of said switching device, means coupling said pair of output signals from said phase shifter circuit to respective inputs of said seventh differential amplifier, means for filtering the outputs of said seventh differential amplifier, and means for coupling the outputs of said seventh differential amplifier corresponding to the phase difference between said color burst signal and said color subcarrier wave signal to bias adjusting inputs of said third and fourth differential amplifiers to control the phase of said oscillation circuit.

2. A color signal processing apparatus according to claim 1 wherein said first, second, third and fourth differential amplifiers of said oscillation circuit include first and second transistors, third and fourth transistors, fifth and sixth transistors, and seventh and eighth transistors, respectively, said four differential amplifiers forming an oscillation amplifier circuit; said transistors being connected as follows:

the collector of said third transistor being connected to the emitters of said fifth and sixth transistor, the collector of said fourth transistor being connected to the emitters of said seventh and eighth transistors, the collectors of said second, fifth and seventh transistors being connected to a common load resistor, a voltage across said common load resistor being applied to base of said fourth transistor through said resonator, a voltage across said resonator being applied to said second and third transistors after being retarded by a predetermined phase angle by said first phase shifter, a fixed bias being applied to base of said first transistor; and, wherein said outputs of said eighth and ninth differential amplifiers are respectively coupled to the bases of said fifth and eighth transistors and to the bases of said sixth and seventh transistors, whereby said four output signals differing in phase by 90° are produced at the collectors of said first, second, third and fourth transistors.

3. A color signal processing circuit according to claim 1 wherein said first and second differential amplifier circuits for said phase shifting circuit comprise:

six emitter coupled differential amplifiers including first and second transistors, third and fourth transistors, fifth and sixth transistors, seventh and eighth transistors ninth and tenth transistors and eleventh and twelfth transistors, respectively;

said transistors being connected as follows:

the bases of said second and third transistors being connected together;

the emitters of said fifth and sixth transistors being connected to the collector of said first transistor;

the emitters of said seventh and eighth transistors being connected to the collector of said second transistor;

the emitters of said ninth and tenth transistors being connected to collector of said third transistor;

the emitters of said eleventh and twelfth transistors being connected to the collector of said fourth transistor;

the collector of said fifth and eleventh transistors, the collectors of said sixth and ninth transistors, the collectors of said seventh and twelfth transistors, and the collectors of said eighth and tenth transistors, respectively, being coupled together; said means for coupling providing said two phase displaced signals from said oscillation circuit to the base of said first transistor and the bases of said second and third transistors, respectively, said two phased displaced signals being 45° apart whereby oscillation signals of phases which are 90° different from each other are produced at the collectors of said fifth through twelfth transistors;

said means for adjusting the bias voltages of said fifth and sixth differential amplifier circuits comprising a means connected to the bases of said fifth through twelfth transistors to change bias voltage thereto, whereby the phases of said pair of output signals are shifted by changing said bias voltages.

4. A color signal processing apparatus according to claim 1 wherein said seventh differential amplifier comprises:

an emitter coupled differential amplifier including a pair of transistors, and said pair of output signals from said phase shifter circuit include:

a subcarrier wave of 45° phase which is applied to the base of one of said pair of transistors and a subcarrier wave of −45° phase which is applied to base of the other of said pair of transistors, said switching device comprising:

an additional transistor connected in series with said commonly coupled emitters, said color burst signal being applied to the base of said additional transistor;

whereby detection output signals which have been derived by phase detecting said color burst signal at 90° phase or −90° phase are produced at the collectors of the transistors of said differential amplifier.

5. A color signal processing apparatus according to claim 4 further comprising:

a color burst gating transistor connected in series with said additional transistor having said color burst signal applied to the base thereof;

a resonance circuit to which a horizontal synchronizing signal is applied;

a means for extracting only those components of the output from said resonance circuit which occur after said horizontal synchronizing signal, as color burst gating pulses; and a means for applying said color burst gating pulses to said color burst gating transistor.

6. A color signal processing apparatus according to claim 4 further comprising:

a color burst gating transistor connected in series with said additional transistor having said color burst signal applied to the base thereof;

a differentiation circuit to which a horizontal synchronizing signal is applied;

a means for extracting only those components of the output from said differentiation circuit which occur after said horizontal synchronizing signal, as color burst gating pulses; and a means for applying said color burst gating pulses to said color burst gating transistor.

7. A color signal processing apparatus according to claim 1 wherein said phase detection circuit comprises:

eighth and ninth differential amplifiers in addition to said seventh differential amplifier, said switching device being a part of said seventh differential amplifier and said seventh, eighth and ninth differential amplifiers being emitter coupled and including first and second transistors, third and fourth transistors, and fifth and sixth transistors, respectively; said transistors being connected as follows:

the commonly coupled emitters of said first and second transistors being connected to the collector of said fifth transistors;

the commonly coupled emitters of said third and fourth transistors being connected to the collector of said sixth transistor;

the bases of said second and third transistors being connected together;

the bases of said first and fourth transistors being connected together; said pair or output signals from said phase shifting circuit including:

a color subcarrier wave of 45° phase which is applied to said commonly coupled bases of said first and fourth transistors and a color subcarrier wave of 45° phase which is applied to said commonly coupled bases of said second and third transistors;

said color burst signal being applied to the base of one of said fifth and sixth transistors, the base of the other of said fifth and sixth transistors being biased at a fixed value;

the collectors of said first and third transistors being coupled together;

the collectors of said second and fourth transistors being coupled together;

whereby detection output signals which have been derived by phase detecting said color burst signal at 90° phase or 90° phase are produced at the collectors of said first through fourth transistors.

8. A color signal processing apparatus according to claim 7 further comprising:

a color burst gating transistor connected in series with said transistor having said color burst signal applied to the base thereof;

a resonance circuit to which a horizontal synchronizing signal is applied;

a means for extracting only those components of the output from said resonance circuit which occur after said horizontal synchronizing signal, as color burst gating pulses; and a means for applying said color burst gating pulses to said color burst gating transistor.

9. A color signal processing apparatus according to claim 7 further comprising:

a color burst gating transistor connected in series with said transistor having said color burst signal applied to the base thereof;

a differentiation circuit to which a horizontal synchronizing signal is applied;

a means for extracting only those components of the output from said differentiation circuit which occur after said horizontal synchronizing signal, as color burst gating pulses; and a means for applying said color burst gating pulses to said color burst gating transistor.

10. A color signal processing circuit for a color television receiver comprising a color demodulator circuit, an oscillator circuit providing a first set of output signals at a specified frequency but phase displaced from one another a predetermined amount for controlling operation of said demodulator circuit, and a second set of output signals at said frequency phase displaced from one another a predetermined amount, a phase shift circuit receiving said second set of signals for providing a third set of output signals at said frequency phase but displaced from one another and from said signals of said second set, phase detector means responseive to said third set of signals and a color burst signal for generating a pair of control signals for said oscillator circuit in accordance with phase differences existing between said color burst signal and said third set of signals, said oscillator circuit comprising first, second, third and fourth differential amplifiers, means for coupling a pair of outputs from said second differential amplifier respectively with said third and fourth differential amplifiers, means for combining the outputs of said first, third and fourth differential amplifier, a resonator coupled to the output of said combining means, means for phase shifting the output of said resonator, means for coupling the output of said phase shifter to the inputs of said first and second differential amplifiers, said first set of output signals being formed at the outputs of said first and second differential amplifiers, said second set of output signals being the signals from said phase shifter provided to the inputs of said first and second differential amplifiers, and means for respectively coupling said pair of control signals to a controlled biasing input of said third and fourth differential amplifiers.

* * * * *